(12) United States Patent
Nacson

(10) Patent No.: US 10,883,964 B2
(45) Date of Patent: Jan. 5, 2021

(54) POLARIZATION DIELECTRIC DISCHARGE SOURCE FOR IMS INSTRUMENT

(71) Applicant: Teknoscan Systems Inc., Vaughan (CA)

(72) Inventor: Sabatino Nacson, Thornhill (CA)

(73) Assignee: TEKNOSCAN SYSTEMS INC, Vaughan (CA)

( * ) Notice: Subject to any disclaimer, the term of this patent is extended or adjusted under 35 U.S.C. 154(b) by 136 days.

(21) Appl. No.: 16/030,265

(22) Filed: Jul. 9, 2018

(65) Prior Publication Data

US 2019/0011400 A1    Jan. 10, 2019

(30) Foreign Application Priority Data

Jul. 7, 2017    (CA) .................................. 2972600

(51) Int. Cl.
 *G01N 27/62* (2006.01)
 *H01J 37/32* (2006.01)
 *G01N 1/02* (2006.01)

(52) U.S. Cl.
 CPC ............. *G01N 27/622* (2013.01); *G01N 1/02* (2013.01); *H01J 37/32027* (2013.01); *H01J 37/32036* (2013.01); *H01J 37/32348* (2013.01); *G01N 2001/022* (2013.01)

(58) Field of Classification Search
 CPC ... G01N 1/02; G01N 27/622; H01J 37/32348; H01J 37/32036; H01J 37/32027
 See application file for complete search history.

(56) References Cited

U.S. PATENT DOCUMENTS

| 2005/0121607 | A1* | 6/2005 | Miller | G01N 27/624 |
| | | | | 250/287 |
| 2010/0002361 | A1* | 1/2010 | Fujino | H01G 11/38 |
| | | | | 361/502 |
| 2016/0314953 | A1* | 10/2016 | Addleman | B05D 3/0254 |
| 2018/0366310 | A1* | 12/2018 | Wolf | H01J 49/105 |

FOREIGN PATENT DOCUMENTS

WO    2015077879 A1    6/2015

OTHER PUBLICATIONS

Zhang "Development of a Dielectric Barrier Discharge Ion Source for Ambinent Mass Spectrometry", 2007, 4 pages.
Vautz "Micro-Plasma: A Novel Ionisation Source for Ion Mobility Spectrometry", 2008, 7 pages.
(Continued)

*Primary Examiner* — David E Smith
*Assistant Examiner* — Hsien C Tsai
(74) *Attorney, Agent, or Firm* — Christensen, Fonder, Dardi & Herbert PLLC; William Anderson

(57) ABSTRACT

An IMS ionizer comprising a wire, a second conductor, and a dielectric, when the first conductor and second conductor are energized to an ionization voltage, discharge ionization occurs. The dielectric is a glass element formed in a tubular shape defining an inner wall. The wire is formed in coils in contact with said inner wall. The second conductor is positioned to define an outer wall of the tube. The tube has an inlet end for receiving the sample, and an outlet end through which the sample exits after ionization.

8 Claims, 4 Drawing Sheets

(56) References Cited

OTHER PUBLICATIONS

Waltman "Characterization of a Distributed Plasma Ionization Source (DPIS) for Ion Mobility Spectrometry and Mass Spectrometry", 2008, 7 pages.
Franzke "Ambient Diode Laser Desorption Dielectric Barrier Discharge Ionization Mass Spectrometry of Nonvolatile Chemicals", 2013, 9 pages.
Horvatic "Discussion of Fundamental Processes in Dielectric Barrier Discharges Used for Solft Ionization", 2014, 10 pages.
Smoluch "Plasma-Based Ambient Ionization Mass Spectrometry in BioAnalytical Sciences" Dec. 24, 2014, 13 pages.
Franze "Dielectric Barrier Discharges Applied for Soft Ionization and Their Mechanism" Oct. 24, 2016, 38 pages.
Coy "A Gapless Micro-Dielectric-Barrier-Discharge Ion Source for Analytical Applications", 34 pages.

\* cited by examiner

POLARIZATION DIELECTRIC DISCHARGE SOURCE FOR IMS INSTRUMENT

RELATED APPLICATION

This application claims priority to Canadian Patent Application No. 2,972,600, entitled POLARIZATION DIELECTRIC DISCHARGE SOURCE FOR IMS INSTRUMENT, filed Jul. 7, 2017, said application is hereby incorporated herein by reference in its entirety.

FIELD OF THE INVENTION

This invention relates to the field of substance detection using ion-mobility spectrometry (IMS).

BACKGROUND OF THE INVENTION

Increasing worldwide terrorist threats have made it crucial to detect all kinds of explosives and other threat substances in order to provide protection for important places such as airports, government buildings, public recreational areas like sport events and infrastructures systems like transportation, marine and air cargo containers. There is also an important interest, both governmental and private, in detecting drugs and other illegal substances in various situations. IMS has been shown over the past 20 years to be a reliable method for trace detection of explosives, drugs, chemical warfare agents, toxic industrial chemicals and various organic environmental pollutants, due to its low detection limit, relatively fast response, hardware simplicity, and portability. IMS-based equipment is presently used in vulnerable places, such as airports, for screening of both people and carry-on luggage.

IMS technology typically includes an ionization apparatus to ionize the sample being tested, after which the ionized sample moves into the ion-mobility spectrometer, whose output is used to determine whether one or more relevant substances are present in the sample.

Traditionally, radioactive sources were used in IMS to ionize the sample, but these sources impose regulatory restrictions such as performing leak tests, radiation license, and storage and disposal issues. These requirements can impede the deployment of the detector in various security applications.

Dielectric barrier discharge ionization (DBDI) is a known process by which reported in 2007 by Zhang et al. In their report, DBDI consisted of glass on copper sheet electrode, and a discharge electrode in a capillary formed to a tip. An ac voltage was applied between the electrodes igniting low temperature plasma between the tip and the surface of the glass plate. Analytes placed on the surface of the glass plate were desorbed and ionized by the plasma. It was shown that 20 amino acids placed on the glass slide could be analyzed. DBDI thus involves using a voltage to create polarization and microscopic discharge of charged particles from the dielectric, which discharge in turn ionizes molecules.

Erwing et al, 2008 disclosed a distributed plasma ionization source (DPIS) that consisted of two electrodes of different sizes separated by a thin dielectric material. They applied a high RF voltage across the electrodes generating plasma in air, which yielded both positive and negative ions. These reactant ions subsequently ionized the sample. The DPIS source suffered from surface deterioration, erratic signals and poor ion yield.

Franzke et al, 2007 developed micro-plasma to ionize a test sample and to be analyzed by ion mobility spectrometer. Their micro-DBDI consisted of a 500 µm capillary tube using helium buffer gas of high purity to create an ionizing jet of primary ions.

Marek Smoluch et al, 2016 published a review paper on plasma-based ambient ionization mass spectrometry techniques. The review covers glow discharge ionization, corona discharge ionization, dielectric barrier discharge ionization and microwave induced discharge. A similar detailed review paper was published by Franzke et al, 2017, presenting various configurations and applications of the DBDI methods and described mechanisms of operation.

Laser desorption DBDI was disclosed by Lopez et al, 2013 and operated at low and high temperature of 200° C. for the heating and ionization of pharmaceutical antibiotics.

Dielectric barrier discharge ionization in characterization of organic compounds separated on thin-layer chromatography plates was disclosed by Ceglowski, 2014. The inventor disclosed a new method for on-spot detection and analysis of resolved peaks on TLC plates. The TLC plate was heated at a particular spot to increase volatility of the separated compound and ionized occurred in the helium gas DBD plasma at applied voltage of 8 kV.

Coy et al, 2016 described a gapless micro-DBD ion source using two crossed glass coated wires. The source operated in pulsed mode with small starting over-voltage and adjustable discharge driver frequency ranging from 200 Hz to 2 KHz. Molecules passing through the cross wires are ionized and directed into a mass spectrometer for analysis.

WO 2015/077879 disclosed a DBDI source for spectrometry. The DBDI source comprised an electrode coated with a glass layer with extended spine along the electrode. A second conductive electrode comprising conductive segments disposed adjacent the first electrode. Each one of the conductive segments contacts the spine at a respective contact location. The dielectric layer of the first electrode separates the conductive member of the first electrode from the spine and the second electrode. High voltage is applied to the electrodes and creates plasma generating locations corresponding to respective crossing of the first electrode and the second electrode.

SUMMARY OF THE INVENTION

The present invention is directed to a polarized dielectric barrier discharge ionization apparatus. Preferably, the apparatus is configured to provide ample surface area on a first electrode, allowing a vapour test sample to be concentrated or enriched.

A preferred embodiment is as follows. The first electrode is a coiled wire electrode. The wire coil is consists of a wire in a helical or coil shape, which is itself shaped to form coils—in other words, the wire consists of coils that are themselves formed into coil. This provides increased surface area. The wire is chemically treated to induce adsorption on its surface of the vaporized sample. The surface of the wire is in contact with dielectric material such as glass or ceramic in glass-lined tubing. Borosilicate glass lined stainless steel or aluminum tubing is one example. The metal acting as the second electrode forms the outside wall of the tube, while the glass forms the inside wall, and the glass is positioned so as to separate the two electrodes.

Also in the preferred embodiment, the chemical sample passing through the coil is trapped on the surface and then thermally desorbed to vaporize the concentrated sample. During that process an AC pulse of 2-3 kV is applied to the second electrode and the wire to create a plasma with electrons that produces primary ions and secondary ions through ion-molecule reactions in the dielectric-wire interface, before the ions are gated into the IMS drift tube.

In an aspect of the invention, there is provided an ionizing apparatus for use in ionizing molecules in a test sample to be analyzed using an ion-mobility spectrometer, the apparatus comprising:

a first conductor, a second conductor, and a dielectric, the first conductor, second conductor, and dielectric being sized, shaped and mutually positioned such that when the first conductor and second conductor are energized to an ionization voltage, discharge ionization occurs at an interface between the first conductor and the dielectric;

the dielectric comprising a glass element formed in a tubular shape so as to define an inner wall of a tube, the dielectric being positioned between the first conductor and the second conductor;

the first conductor comprising a wire formed coils in contact with said inner wall, and being electrically connectable to an AC voltage pulse generator;

the second conductor comprising a conducting layer positioned so as to define an outer wall of the tube, and being electrically connectable to the AC voltage pulse generator;

the tube comprising an inlet end for receiving the sample, and an outlet end through which the sample exits after ionization.

BRIEF DESCRIPTION OF THE DRAWINGS

Reference will now be made, by way of example only, to preferred embodiments of the invention and in which.

DETAILED DESCRIPTION OF THE PREFERRED EMBODIMENTS

Figure 1:
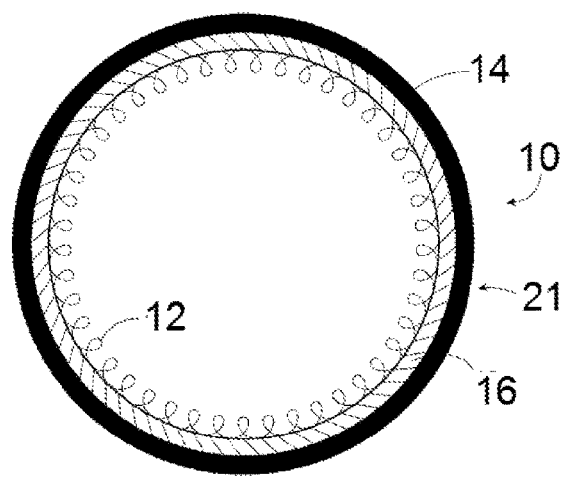
FIG. 1 is an end view of an embodiment of the apparatus.
Figure 2:
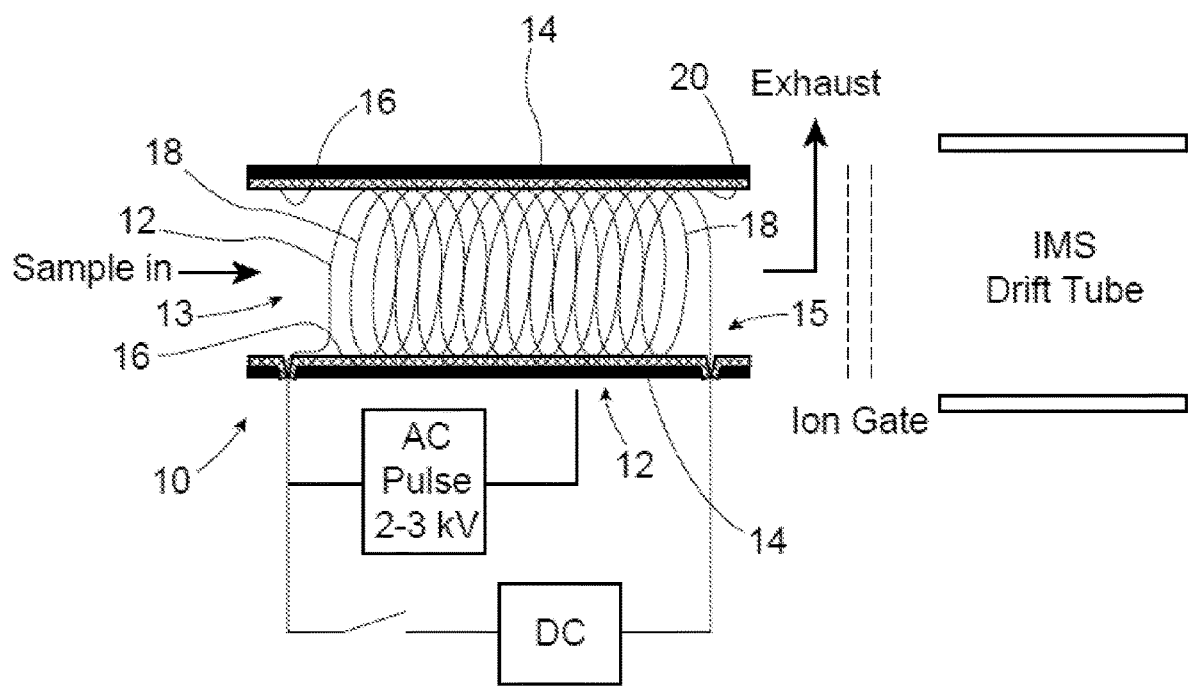
FIG. 2 is a schematic cross-sectional elevation view of an embodiment of the apparatus in fluid communication with an IMS drift tube.
Figure 3:
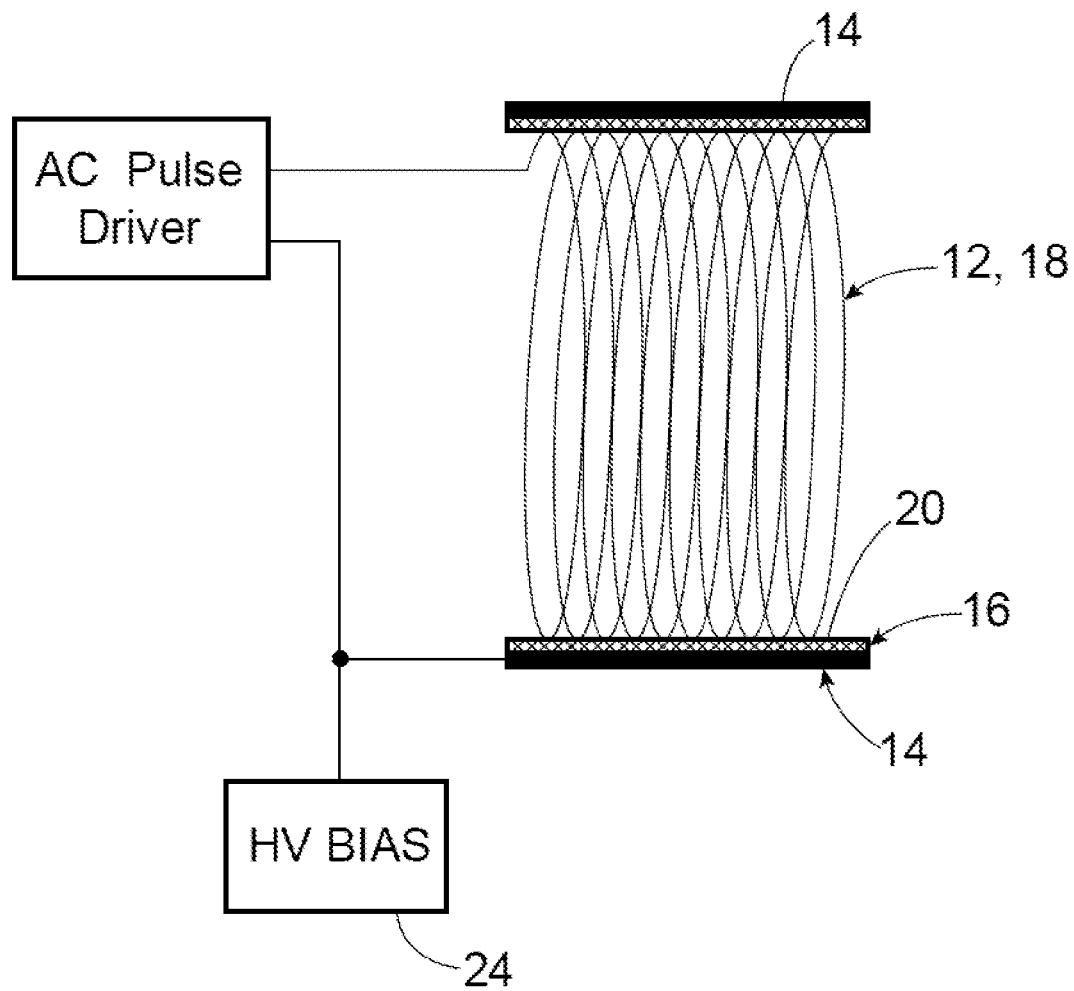
FIG. 3 is a schematic cross-sectional elevation view of an embodiment of the apparatus.

Referring now to FIGS. 1-3, the apparatus 10 is shown. The apparatus comprises a first conductor or electrode preferably in the form of wire 12 and second conductor or electrode preferably in the form of a steel or aluminum outer layer 14 (the invention comprehends any suitable conductive material from both conductors). Separating the two conductors 12, 14, and insulating them from one another is a dielectric, preferably in the form of glass layer 16. Glass layer 16 is preferably formed in a tubular shape and defines the inner wall 20 of a tube, which tube is preferably generally the shape of apparatus 10. The tube preferably comprises an inlet end 13 by which the sample enters the apparatus, and an outlet end 15 by which it exits the apparatus toward the IMS.

Figure 4:
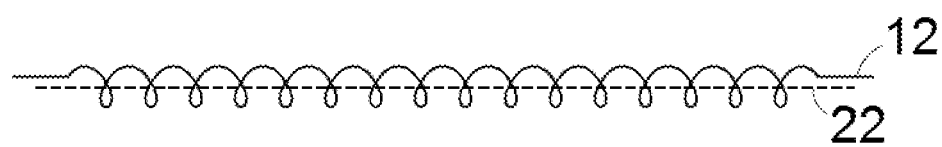
FIG. 4 is a side view of the wire prior to its being arranged in a coil inside the preferred tubular dielectric.
Figure 8:
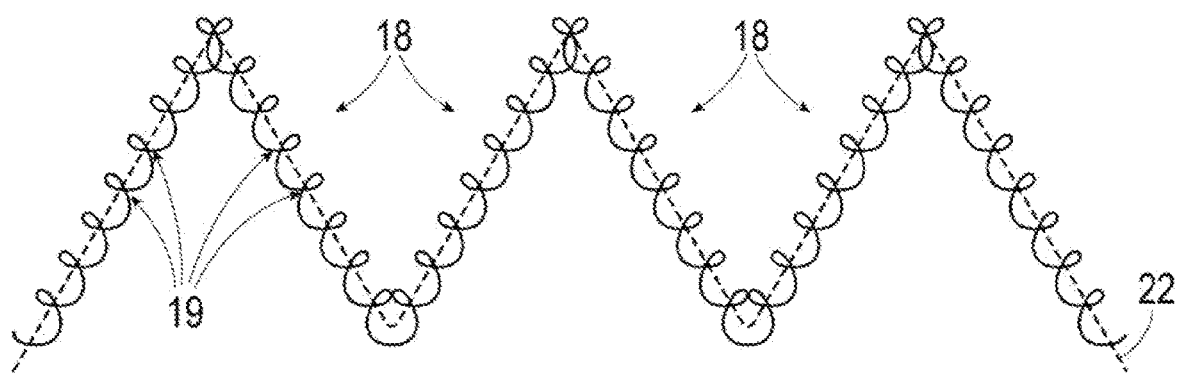
FIG. 8 is a simplified drawing of the preferred wire.

The wire is preferably formed in a generally helical shape, with the helically-formed wire itself being formed in generally helical coils 18 so that the so that the wire has many points of contact with the inner wall 20 of the tube formed by glass layer 16. Stated differently, the wire 12 is formed in a helix which defines a longitudinal axis 22 (see FIG. 4). The wire 12, already including small coils as a result of its generally helical shape, is then further formed into larger coils by forming the wire so that the longitudinal axis itself is formed in a generally helical coil shape (see FIG. 8). Preferably, the coils 18 of the wire 12 are consistently positioned in contact with glass 16 to maximize contact between wire 12 and glass 16.

Second conductor 14 is preferably a metal layer bonded to glass 12 and position so as to define an outer wall 21 of the tube.

In operation, preferably, the wire 12 acts as an electrode in contact with glass 12, which glass is polarized upon application of a high voltage pulse. It will be appreciated that the invention comprehends other possible dielectrics, including but not limited to ceramic dielectrics.

Preferably, the wire 12 is coated with nanocarbon, which has affinity for organics, to facilitate trapping and pre-concentration/enrichment of the sample on wire 12.

Preferably, the sample is then desorbed by means of application of a DC voltage to the wire 12. The DC voltage is preferably provided by DC voltage generator 24, to which the conductors are electrically connectable.

The conductors 12, 14 are preferably energized at the same voltage, and polarization of the glass 12 occurs followed by charging of the inner wall 20. The amount of charges formed at the wall 20 by polarization/charging is proportional to the change of the voltage. Preferably, an AC or square wave pulse generator 26 (to which the conductors are electrically connectable) creates AC pulses (ionization voltage) to create the plasma for ionization of the desorbed sample.

Preferably, the AC pulse is timed to occur after the DC voltage desorbs the sample, so that the sample molecules have moved off of wire 12 and are in the tube and available to be ionized. Thus, the apparatus 10 preferably functions to perform desorption of the concentrated sample by applying a DC voltage to the wire 12 and AC pulse to induce soft ionization of the gas phase sample at the dielectric coil interface.

The polarized dielectric discharges are generated at the interface between glass 16 and wire 12—i.e. by multiple points of contact between the dielectric material and the wire 12, separating the ionization area (in the tube, away from the glass 12) and the discharge area (at glass 12, at the points of contact with the first conductor).

There are possible benefits to the shape and configuration of wire 12 as described above. One is that it can be formed with substantial length, which increases the total resistance of the coil, thus facilitating the generation of more heat in response to DC through the coil, which in turn facilitates faster evaporation and release of the sample into the drift tube. Another is the provision of increased surface area for trapping the incoming sample.

In the prior art, the plasma is separated from sample introduction for the reason because, inside the plasma, the electron density is too high; therefore organic molecules might be fragmented to smaller ions or non-ionized species. In an embodiment of this invention, the plasma is not separated from the place where the sample is introduced (i.e. the ionization area). The present apparatus, in this embodiment, has not shown extensive fragmentation in either the positive or negative ions' ion mobility spectra.

Figure 5:
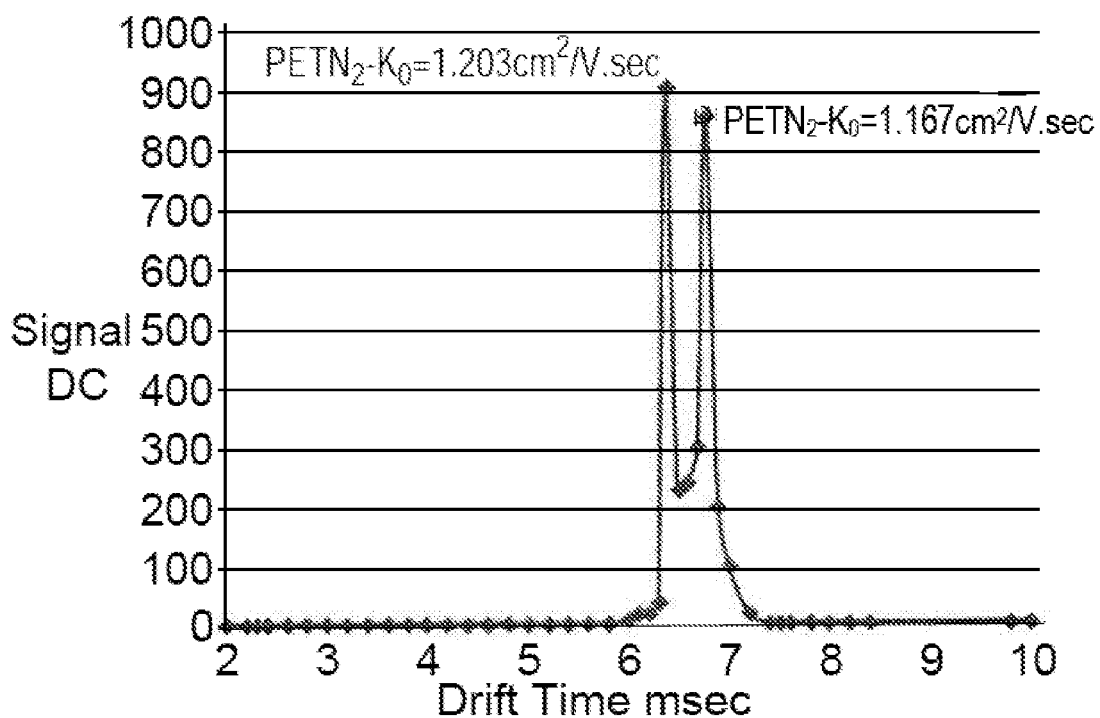
FIG. 5 is an example graph showing ion peaks for an example molecule being detected by an IMS.
Figure 6:
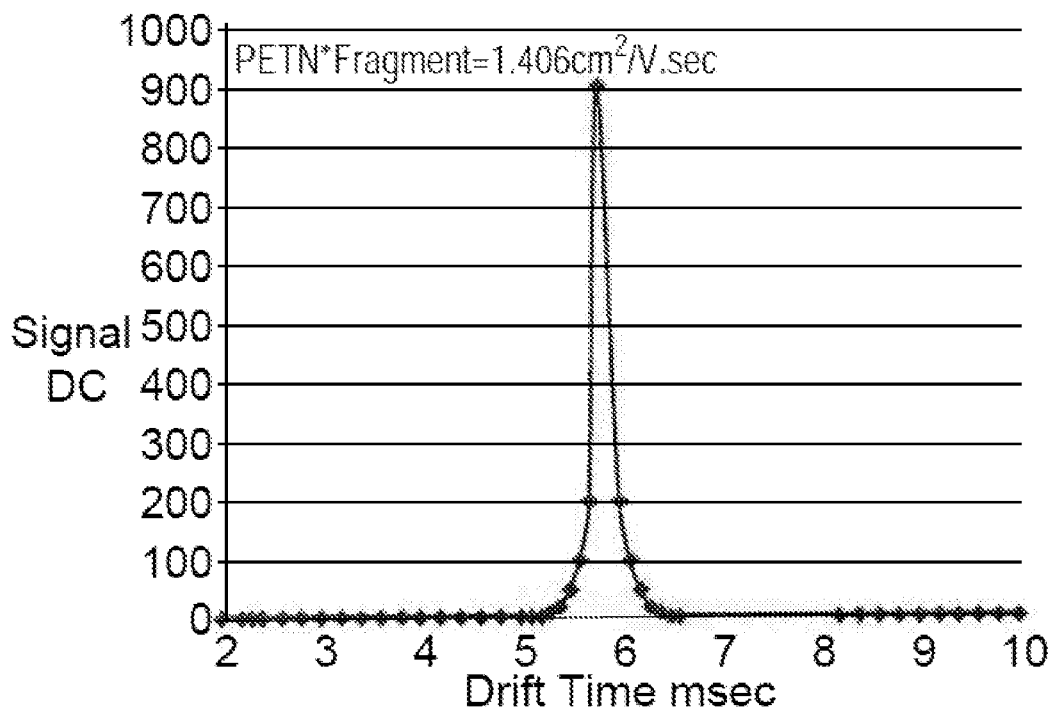
FIG. 6 is an example graph showing ion peaks for an example molecule being detected by an IMS.
Figure 7:
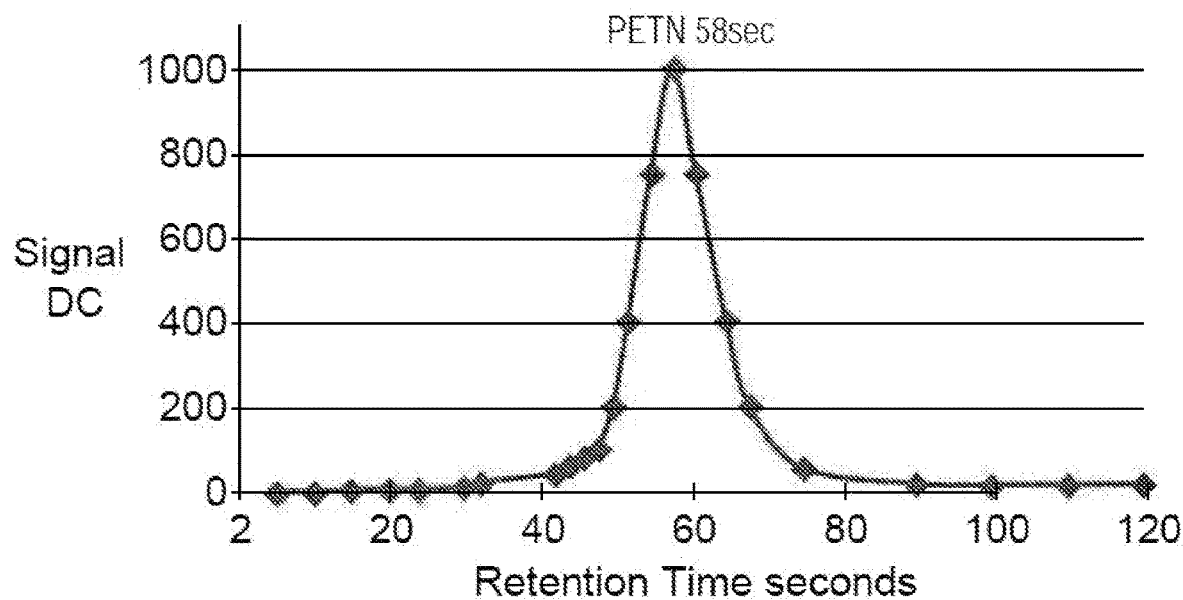
FIG. 7 is an example graph showing GC retention time for an example molecule being detected by an IMS in an example system that includes gas chromatography for pre-separation.

An example of the present invention in operation is described. Referring now to FIGS. 5-7, separation of PETN plastic explosive by gas chromatography is shown followed by PDBD ionization and detection by ion mobility spectrometer operating in fast switching mode.

PETN retention time at 58 seconds produced two PETN negatively ionized molecules, identified as PETN cluster with chloride dopant to form (PETN+Cl)$^-$ ion at mass 351 amu and PETN molecular ion PETN$^-$ at mass 315 amu at their respective reduced mobility constants of 1.203 cm$^2$/V·sec and 1.167 cm$^2$/V·sec.

PETN also is detected in the positive ion mode at the same GC retention time producing a fragment peak at reduced mobility constant of 1.406 cm$^2$/V·sec corresponding to tentative mass of 206 amu or tentatively loss of $CH_2N_2O_4$ group.

This example embodiment was operated at a source temperature of 170-200° C. 170° C. is believed to be the preferred temperature.

Ionization of explosives in the gas phase proceeds after the vaporization of the explosive molecules and the microcontroller initiation of the pulsed waveform at optimized voltage. In some embodiments, the pulse have amplitudes between 1000 to 5000V, pulse period of 3-6 μsec of in the range of 100-150 kHz.

Energetic electrons produced on the polarized dielectric induce ionization of ambient gases, which in turn through ion-molecule reactions produced relatively high density reagent ions. The introduced gas phase sample is then ionized by these secondary ion-molecule reactions.

Once the sample molecules have undergone ionization for analysis, they travel out through outlet 15 to the IMS.

It will be appreciated that the invention comprehends other forms besides the preferred forms described herein, and may take any form comprehended by the full breadth of this description.

The invention claimed is:

1. An ionizing apparatus for use in ionizing molecules in a test sample to be analyzed using an ion-mobility spectrometer, the apparatus comprising:
   a first conductor, a second conductor, and a dielectric, the first conductor, second conductor, and dielectric being sized, shaped and mutually positioned such that when the first conductor and second conductor are energized to an ionization voltage, discharge ionization occurs at an interface between the first conductor and the dielectric;
   the dielectric comprising a glass element formed in a tubular shape so as to define an inner wall of a tube, the dielectric being positioned between the first conductor and the second conductor to insulate the first conductor from the second conductor;
   the first conductor comprising a wire formed in coils that are in contact with said inner wall, and being electrically connectable to an AC voltage pulse generator;
   the second conductor comprising a conducting layer positioned so as to define an outer wall of the tube, and being electrically connectable to the AC voltage pulse generator; and
   the tube comprising an inlet end for receiving the sample, and an outlet end through which the sample exits after ionization,
   wherein the first conductor is coated with a substance having an affinity for organics to enhance trapping of the sample on the first conductor.

2. An apparatus as claimed in claim 1, wherein the wire comprises a generally helically shaped wire defining a longitudinal axis, and wherein said longitudinal axis is itself shaped generally helically so as to form said coils with said wire.

3. An ionizing apparatus as claimed in claim 1, wherein the substance comprises a nanocarbon.

4. An ionizing apparatus as claimed in claim 1, wherein the conductors are connectable to a DC voltage generator to cause heating of the first conductor to release the sample when it is trapped on the first conductor.

5. An ionizing apparatus as claimed in claim 1, wherein the dielectric comprises borosilicate glass.

6. An ionizing apparatus as claimed in claim 1, wherein the second conductor is composed of steel or aluminum.

7. An ionizing apparatus as claimed in claim 2, wherein the conductors are connectable to a DC voltage generator to cause heating of the first conductor to release the sample when it is trapped on the first conductor.

8. An ionizing apparatus as claimed in claim 1, wherein the conductors are connectable to a DC voltage generator to cause heating of the first conductor to release the sample when it is trapped on the first conductor.

* * * * *